United States Patent
Ma et al.

(10) Patent No.: US 8,384,156 B2
(45) Date of Patent: Feb. 26, 2013

(54) COMPLEMENTARY METAL OXIDE SEMICONDUCTOR DEVICES

(75) Inventors: Tso-Ping Ma, Branford, CT (US); Minjoo Lee, Hamden, CT (US); Xiao Sun, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 12/996,067

(22) PCT Filed: Jun. 15, 2009

(86) PCT No.: PCT/IB2009/005940
§ 371 (c)(1),
(2), (4) Date: Apr. 26, 2011

(87) PCT Pub. No.: WO2010/007478
PCT Pub. Date: Jan. 21, 2010

(65) Prior Publication Data
US 2011/0187412 A1    Aug. 4, 2011

Related U.S. Application Data

(60) Provisional application No. 61/061,144, filed on Jun. 13, 2008.

(51) Int. Cl.
*H01L 27/12* (2006.01)
*H01L 25/00* (2006.01)

(52) U.S. Cl. ........ 257/347; 257/348; 257/324; 326/102; 326/104

(58) Field of Classification Search .................. 257/347, 257/348, 324, 344, 390, 382, 314, 352; 438/199
See application file for complete search history.

(56) References Cited

U.S. PATENT DOCUMENTS

| | | | |
|---|---|---|---|
| 6,452,233 B1 | 9/2002 | Masuda | |
| 6,855,988 B2 * | 2/2005 | Madurawe | 257/347 |
| 7,180,135 B1 | 2/2007 | Ioannou et al. | |
| 7,663,189 B2 * | 2/2010 | Fukuda | 257/352 |
| 7,710,771 B2 * | 5/2010 | Kuo et al. | 365/184 |
| 2005/0007839 A1 * | 1/2005 | Madurawe | 365/199 |
| 2006/0138543 A1 * | 6/2006 | Fukuda | 257/352 |

FOREIGN PATENT DOCUMENTS
EP    0497216 A2    8/1992

OTHER PUBLICATIONS

Manners, D., "University of Texas makes flexible CMOS", ElectronicsWeekly.com, Jun. 11, 2009, http://www.electronicsweekly.com/Articles/2009/06/11/46268/university-of-texas-makes-flexible-cmos.htm, 3 pages.
Morena, Enrico, "International Search Report", for PCT/IB2009/005940, as mailed Nov. 5, 2009, 5 pages.

* cited by examiner

*Primary Examiner* — Vibol Tan
(74) *Attorney, Agent, or Firm* — Winstead PC

(57) ABSTRACT

Improvements in Complementary Metal Oxide Semiconductor (CMOS) devices; in particular, field effect transistors (FETs) and devices using said transistors which are able to take advantage of the higher carrier mobility of electrons compared to holes by replacing the conventional p-channel transistor with an n-channel transistor having a double gate (or vice versa): Such a. Unipolar CMOS (U-CMOS) transistor can be realized by adapting the source and/or the drain such that when the body region undergoes inversion at a first surface current, is able to flow between the drain and the source and when the body region undergoes inversion at a second surface current is not able to flow between the drain and the source. Various logic gates may be constructed using U-CMOS transistors.

32 Claims, 11 Drawing Sheets

All NFET's NOR (NAND, AND, OR)

| A | ~A | B | ~B | C1 | C2 | V_out |
|---|----|---|----|----|----|-------|
| 1 | 0 | 1 | 0 | On | Off | 0 |
| 1/0 | 0/1 | 0/1 | 1/0 | On | Off | 0 |
| 0 | 1 | 0 | 1 | Off | On | 1 |

Change A,B with ~A,~B (complements), and Change GND with Vdd, to get NAND, AND, OR.

COMPLEMENTARY METAL OXIDE SEMICONDUCTOR DEVICES

CROSS-REFERENCE TO RELATED APPLICATIONS

This application claims priority from and incorporates by reference the entire disclosure of U.S. Provisional Patent Application No. 61/061,144, which was filed on Jun. 13, 2008.

FIELD OF THE INVENTION

The present invention relates to improvements in Complementary Metal Oxide Semiconductor (CMOS) devices; in particular, CMOS devices which are able to take advantage of the higher carrier mobility of electrons compared to holes by replacing the conventional p-channel transistor with an n-channel transistor having a negative threshold voltage, and vice versa.

BACKGROUND OF THE INVENTION

The building blocks of conventional Complementary Metal-Oxide-Semiconductor (CMOS) logic technology consist of an N-channel MOS Field-Effect Transistor (NMOSFET) (1) and a P-channel MOS Field-Effect Transistor (PMOSFET) (11), as shown schematically in FIGS. 1(*a*) and 1(*b*), respectively. The examples shown use Semiconductor on Insulator (SOI) Technology, to facilitate comparison with the invention. The source (3,13) and drain (7,17) are n and p type, respectively, and the body (4,14) is p and n type, respectively.

As illustrated, and as will be readily understood by the man skilled in the art, these transistors (1,11) are normally "off"; in order to turn on either transistor (1,11) and allow current to flow between the source (3,13) and the drain (7,17), a sufficiently large gate voltage needs to be applied to the gate electrode (5,15) relative to the substrate (8,18) (the voltage applied to the substrate (8,18) is effectively the same as that applied to the source (9,19)). The minimum gate voltage (relative to the source) that is required to turn on a transistor is called the threshold voltage ($V_t$). Normally, $V_t$ is positive for NMOSFET devices, and negative for PMOSFET devices.

FIG. 2 shows a logic inverter circuit (21), consisting of an NMOSFET (1) and a PMOSFET (11)—corresponding to those illustrated in FIGS. 1(*a*) and 1(*b*)—on a SOI wafer. To illustrate the operating principle, we shall assume that the threshold voltage ($V_{tn}$) for the NMOSFET (1) is 1.0 V, and that the threshold voltage ($V_{tp}$) for the PMOSFET (11) is −1.0 V, and the power supply voltage ($V_{DD}$) is 3.0 V. We also define that the logic "1" state (or logic "high" state) corresponds to the voltage range of 2.0 to 3.0 V, and the logic "0" state (or logic "low" state) corresponds to the voltage of 0 to 1.0 V. When the input voltage ($V_{in}$) is 3.0 V (i.e., "high") with respect to ground, the NMOSFET (1) is turned on (because the NMOSFET gate-to-source voltage is 3.0V, which exceeds $V_{tn}$), and the PMOSFET is off (because the PMOSFET gate-to-source voltage is 0 V). As a result, $V_{out}$ is ~0 V (i.e., "low"). On the other hand, when the input voltage is 0 V (i.e., "low") with respect to ground, the NMOSFET is turned off (because the NMOSFET gate-to-source voltage is below $V_{tn}$), and the PMOSFET is turned on (because the PMOSFET gate-to-source voltage is −3.0 V, which exceeds $V_{tp}$). As a result, $V_{out}$ is ~3.0V (i.e., "high"). Thus the inverter behaves as expected; a "high" input results in a "low" output and a "low" input results in a "high" output.

Note that a key feature of the CMOS inverter is that, in either state, the standby power consumption is very low because one of the transistors is always turned off; therefore there is very little current flowing between the power supply and ground. This is the main reason why CMOS technology overtook NMOS technology (which pre-dated CMOS) for digital applications in the 1980's.

The drive current of either the NMOSFET or the PMOSFET is approximately proportional to carrier mobility (electron or hole) and channel width. As illustrated in Table 1 (below), the mobility of electrons ($\mu_e$) differs from the mobility of holes ($\mu_p$) for a given semiconductor. Therefore in a CMOS inverter circuit, or a logic circuit based on CMOS inverters, because hole mobility is generally lower than electron mobility the channel width of the PMOSFET ($W_p$) is usually greater than that of the NMOSFET ($W_n$), to compensate. More specifically, the $W_p/W_n$ ratio is set at the mobility ratio of $\mu_e/\mu_p$ for the purpose of current matching.

For example, in Si-based logic circuits, the width of the PMOSFET is typically ~2 times that of the NMOSFET, corresponding to the $\mu_e/\mu_p$ ratio of Si (see Table 1), for current matching.

For a semiconductor that has very large $\mu_e/\mu_p$ ratio (say a ratio of 20), one must engineer the device so as to make the $W_p/W_n$ ratio similarly large for the CMOS inverter to achieve current matching. In such cases, the large $W_p$ required for current matching results in large PMOSFET transistor sizes, in turn increasing the chip cost and making the overall circuit layout difficult to design. It should be noted that in many III-V semiconductors with high electron mobility, the hole mobility can be 20 times smaller.

Table 1 shows the electron and hole mobility for several different semiconductors, from which such large $\mu_e/\mu_p$ ratios are apparent:

|  | Si | Ge | GaAs | In$_{0.53}$Ga$_{0.47}$As | InAs |
| --- | --- | --- | --- | --- | --- |
| Eg (eV) | 1.1 | 0.66 | 1.4 | 0.75 | 0.35 |
| $\mu_n$ (cm$^2$/v-s) | 1,350 | 3,900 | 4,600 | 7,800 | 40,000 |
| $\mu_p$ (cm$^2$/v-s) | 480 | 1,900 | 500 | 350 | <500 |
| m*/m$_o$ | 0.165 | 0.12 | 0.067 | 0.041 | 0.024 |

It is therefore an object of at least one embodiment of the present invention to obviate and mitigate the limitations of conventional CMOS devices.

SUMMARY OF THE INVENTION

According to a first aspect of the present invention, there is provided an improved complementary metal oxide semiconductor (CMOS) field effect transistor (FET), the FET comprising a drain, a source and a body region therebetween;

wherein the drain and/or the source is adapted such that when the body region undergoes inversion at a first surface current is able to flow between the drain and the source and when the body region undergoes inversion at a second surface current is not able to flow between the drain and the source.

Preferably, the FET comprises an enhancement-mode FET with an inverted channel at one or both of the first and second surfaces. Alternatively, the FET comprises an enhancement mode FET with an accumulated channel at one or both of the first and second surfaces.

Preferably, the FET comprises a front channel at the first surface associated with a front gate and a back channel at the second surface associated with a back gate, wherein the front channel is capable of inversion when a positive voltage with respect to the back gate is applied to the front gate and the back channel is capable of inversion when a negative voltage with respect to the back gate is applied to the front gate.

Alternatively, the FET comprises a front channel at the first surface and a back channel at the second surface, wherein the front channel is capable of inversion when a negative voltage with respect to the back gate is applied to the front gate and the back channel is capable of inversion when a positive voltage with respect to the back gate is applied to the front gate.

Preferably, the source and/or the drain is separated from the back channel such that when the front channel is inverted current may flow between the source and the drain but when the back channel is inverted current may not flow between the source and the drain.

Alternatively, wherein the source and/or the drain is separated from the front channel such that when the front channel is inverted current may not flow between the source and the drain and when the back channel is inverted current may flow between the source and the drain.

According to a second aspect of the present invention, there is provided an improved complementary metal oxide semiconductor (CMOS) device comprising a plurality of FETs of the first aspect;
wherein the body region of each of the plurality of FETs comprises an n-type semiconductor material or the body region of each of the plurality of field effect transistors comprises a p-type semiconductor material.

Preferably, the device comprises at least a first FET and a second FET wherein the drain and/or the source of the first FET is adapted such that the first FET has a positive threshold voltage and wherein the drain and/or the source of the second FET is adapted such that the second FET has a positive threshold voltage.

Preferably, the device comprises at least a first FET and a second FET wherein the first FET is connected to the second FET.

Such a transistor or device overcomes the problems caused by the disparity between electron and hole mobilities in semiconductor materials by enabling use of or using either all n-type channels or all p-type channels, typically when electron or hole mobilities are higher (respectively).

In conventional CMOS devices, both an n-type FET with a positive threshold voltage and a p-type FET with a negative threshold voltage are present. The use of a n-type FET with a negative threshold voltage or a p-type FET with a positive threshold voltage thus allows a CMOS device to be comprise all n-type or all p-type FETs.

Preferably, at least one of the FETs comprises an enhancement-mode FET with an inverted channel. Alternatively, or additionally, at least one of the FETs comprises an enhancement mode FET with an accumulated channel.

Optionally, the CMOS device is an inverter comprising a first FET and a second FET connected in series, the first field effect transistor having a positive threshold voltage and the second field effect transistor having a negative threshold voltage.

Preferably, at least one of the FETs comprise a front channel at the first surface and a back channel at the second surface, wherein the front channel is capable of inversion when a positive voltage with respect to the back gate is applied to the front gate and the back channel is capable of inversion when a negative voltage with respect to the back gate is applied to the front gate.

Alternatively, at least one of the FETs comprise a front channel at the first surface and a back channel at the second surface, wherein the front channel is capable of inversion when a negative voltage with respect to the back gate is applied to the front gate and the back channel is capable of inversion when a positive voltage with respect to the back gate is applied to the front gate.

Optionally, the source is separated from the back channel such that when the front channel is inverted current may flow between the source and the drain but when the back channel is inverted current may not flow between the source and the drain.

Alternatively, the source is separated from the front channel such that when the front channel is inverted current may not between the source and the drain and when the back channel is inverted current may flow between the source and the drain.

Further alternatively, the drain is separated from the back channel such that when the front channel is inverted current may flow between the source and the drain but when the back channel is inverted current may not flow between the source and the drain.

Yet further alternatively, the drain is separated from the front channel such that when the front channel is inverted current may not flow between the source and the drain and when the back channel is inverted current may flow between the source and the drain.

Optionally, the drain of the first FET comprises or is integrally formed with the source of the second FET.

According to a third aspect of the present invention, there is provided a field effect transistor comprising:
a substrate and a back gate contact connected to the substrate;
a semiconductor layer comprising a doped source region and a doped drain region of a first type separated by a body region of a second type;
a first insulator layer separating the semiconductor layer from the substrate;
a conductor layer comprising a source contact connected to the doped source region, a drain contact connected to the doped drain region, and a front gate contact associated with the body region;
a second insulator layer separating the body region of the semiconductor layer and the gate contact, the conductor layer and second insulator layer on the opposite side of the semiconductor layer from the substrate;
wherein;
the body region undergoes inversion when a voltage exceeding a threshold voltage is applied to the back gate contact, forming a back channel of charge carriers within the body region proximal to the first insulator layer; and
the doped source region and/or the doped drain region is partially separated from the body region proximal to the first insulator layer such that the doped source region or doped drain region is not in contact with the back channel when said voltage is applied.

Preferably, the doped source region and/or doped drain region is separated from the first insulator layer by a distance that corresponds to or is larger than the depth of the back channel formed when said voltage is applied.

Optionally, the transistor further comprises one or more spacers between the first insulator layer and the doped source region and/or doped drain region, the depth of the spacers corresponding to or greater than the depth of the back channel.

Optionally, one or more of the spacers is integrally formed with the insulator layer.

According to a fourth aspect of the present invention, there is provided a field effect transistor comprising:
- a substrate and a back gate contact connected to the substrate;
- a semiconductor layer comprising a doped source region and a doped drain region of a first type separated by a body region of a second type;
- a first insulator layer separating the semiconductor layer from the substrate;
- a conductor layer comprising a source contact connected to the doped source region, a drain contact connected to the doped drain region, and a front gate contact associated with the body region;
- a second insulator layer separating the body region of the semiconductor layer and the front gate contact, the conductor layer and second insulator layer on the opposite side of the semiconductor layer from the substrate;
- wherein;
- the body region undergoes inversion when a voltage exceeding a threshold voltage is applied to the front gate contact, forming a front channel of charge carriers within the body region proximal to the second insulator layer; and
- the doped source region and/or doped drain region is partially separated from the body region proximal to the second insulator layer such that the doped source region and/or doped drain region is not in contact with the front channel when said voltage is applied.

Preferably, the transistor further comprises one or more spacers between the second insulator layer and the doped source region and/or doped drain region, the depth of the spacers corresponding to or greater than the depth of the front channel.

Optionally, one or more of the spacers is integrally formed with the second insulator layer.

Alternatively, the transistor further comprises one or more spacers between a portion of the body region and the doped source region and/or doped drain region, the spacers extending to a depth therebetween that corresponds to or is greater than the depth of the front channel.

According to a fifth aspect of the present invention, there is provided a logic inverter comprising:
- a front channel transistor comprising a field effect transistor according to the third aspect; and
- a back channel transistor comprising a field effect transistor according to the fourth aspect;
- wherein:
- the source of the back channel field effect transistor is operatively connected to the drain of the front channel field effect transistor.

Optionally, the logic inverter comprises a substrate which forms the substrate of both the front channel field effect transistor and the back channel field effect transistor.

Most preferably, the drain of the front field effect transistor comprises or is integrally formed with the source of the back field effect transistor.

Preferably, the substrate comprises a buried back gate comprising a doped semiconductor material that forms a back gate of both the front field effect transistor and the back field effect transistor. Alternatively, the buried back gate comprises a conducting material.

According to a sixth aspect of the present invention, there is provided a logic circuit comprising one or more field effect transistors in accordance with the third and/or fourth aspects.

Optionally, the logic circuit comprises one or more logic inverters in accordance with the fifth aspect.

BRIEF DESCRIPTION OF THE FIGURES

The present invention will now be described by way of example only and with reference to the accompanying figures in which:

FIG. 3 illustrates in schematic form how a conventional NMOSFET, built on a SOI (semiconductor-on-insulator) wafer, may undergo inversion at either the front or back surface of the semiconductor and cause the NMOSFET to turn on;

DETAILED DESCRIPTION OF THE INVENTION

To overcome the problem caused by the disparity between electron and hole mobilities, the Applicant proposes a Unipolar CMOS (U-CMOS) logic concept, which utilizes only NMOSFETs (or PMOSFETs) in a novel CMOS-type inverter. Such a U-CMOS inverter can serve as the basis for all possible logic circuits as will be readily appreciated by the skilled person. Since only NMOSFETs (or PMOSFETs) are used, the bottleneck due to the small hole (or electron) mobility is removed, and high-speed complementary circuits can be realized without the penalty of large $W_p/W_n$ ratios.

Despite the lack of complementary n and p channels from which CMOS takes its name, the term "complementary" is retained and should be emphasized here, because it distinguishes U-CMOS from conventional NMOS logic where the inverter dissipates full "on" current in one of the two logic states. As stated above, this high stand-by power consumption was the major problem that led to CMOS technology (which consumes much less stand-by power) replacing it.

The U-CMOS utilizes the double channel capability of a MOSFET built either with a SOI structure or 3-D vertical channels. For convenience and simplicity, a SOI version operating in enhancement-mode is described here to illustrate the principle of operation of the U-CMOS inverter but the skilled person will be able to translate and apply the principles of operation into different and more complicated device structures, and to other operational modes such as depletion-mode.

Figure 3:
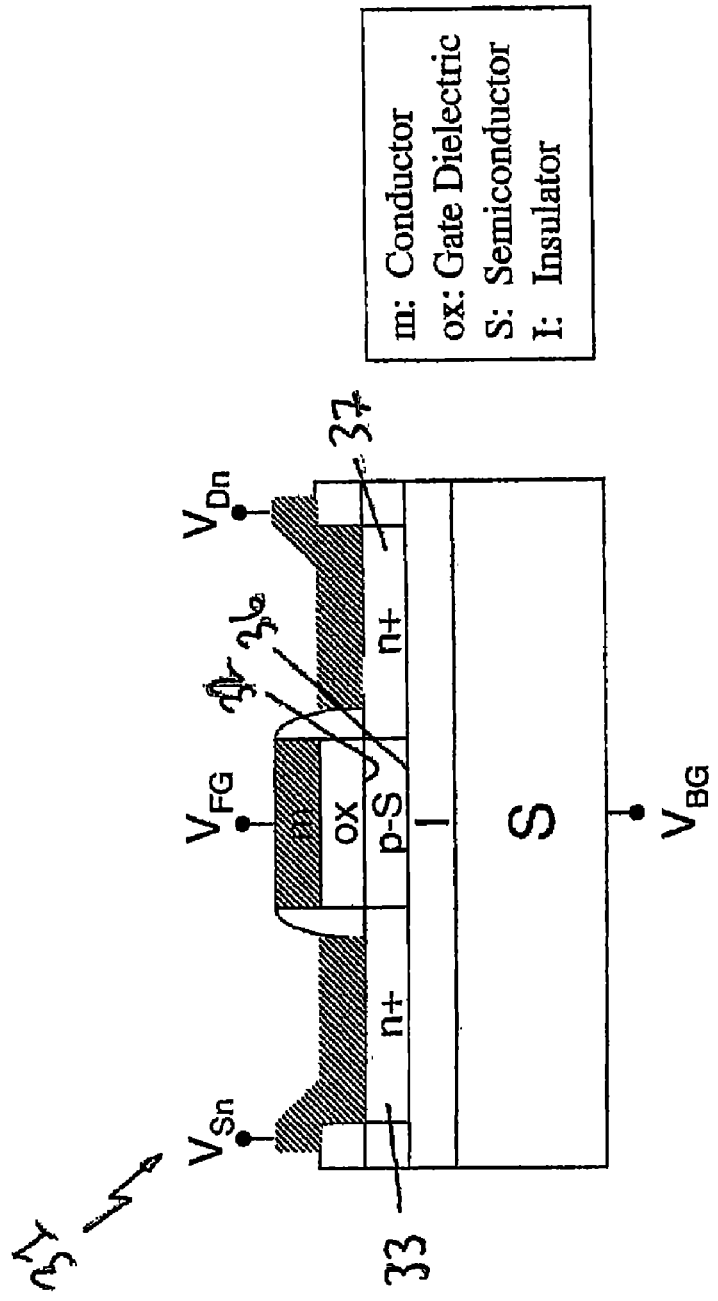

As shown in FIG. 3, the conduction channel between the source (33) and the drain (37) for a MOSFET (31) built with a SOI structure (where S denotes a semiconductor, and I denotes the bottom insulator) could be formed by the inversion layer either at the front dielectric/semiconductor interface (32), or at the back semiconductor/insulator interface (36). To turn on the front-channel transistor, the front gate voltage ($V_{fg}$) must exceed the threshold voltage of the front channel ($V_{tf}$) with respect to its source.

Similarly, to turn on the back-channel transistor, the back gate voltage ($V_{bg}$) must exceed the threshold voltage of the back channel ($V_{tb}$) with respect to its source. For example, for $V_{tf}=V_{tb}=1.0$ V, one requires $V_{fg}>1.0$ V with respect to the source to turn on the front-channel transistor, while one requires $V_{bg}>1.0$ V to turn on the back-channel transistor.

The transistor (31) in the above example will turn on with either the front-channel transistor or the back-channel transistor inverted. To make the transistor (31) turn on only when the front-channel is inverted, but not when the back-channel is inverted, the source (33) (or drain (37)) junction can be modified, e.g. by making it shallower as shown in the transistor (101) illustrated in FIG. 4(a). In this case, when the front channel (i.e. at the front dielectric/semiconductor interface (102)) is inverted, the channel current flows from the drain (107) to the source (103), just as in the device (31) discussed above (with reference to FIG. 3). However, when the back channel (i.e. at the back semiconductor/insulator interface (106)) is inverted, the channel current cannot flow from the drain (107) to the source (103) through the back inversion channel, because the n+ region of the source (103) (or drain (107)) does not reach the back channel, and therefore the source and drain are disconnected. Note that the illustrated example shows a shallower source (103) and an unmodified drain (107) but in practice either or both may be modified.

The shallower source (or drain) junction can be achieved in a number of ways; for example by use of one or more spacers which is of a sufficient size to separate the source (or drain) from the back channel.

Figure 4:
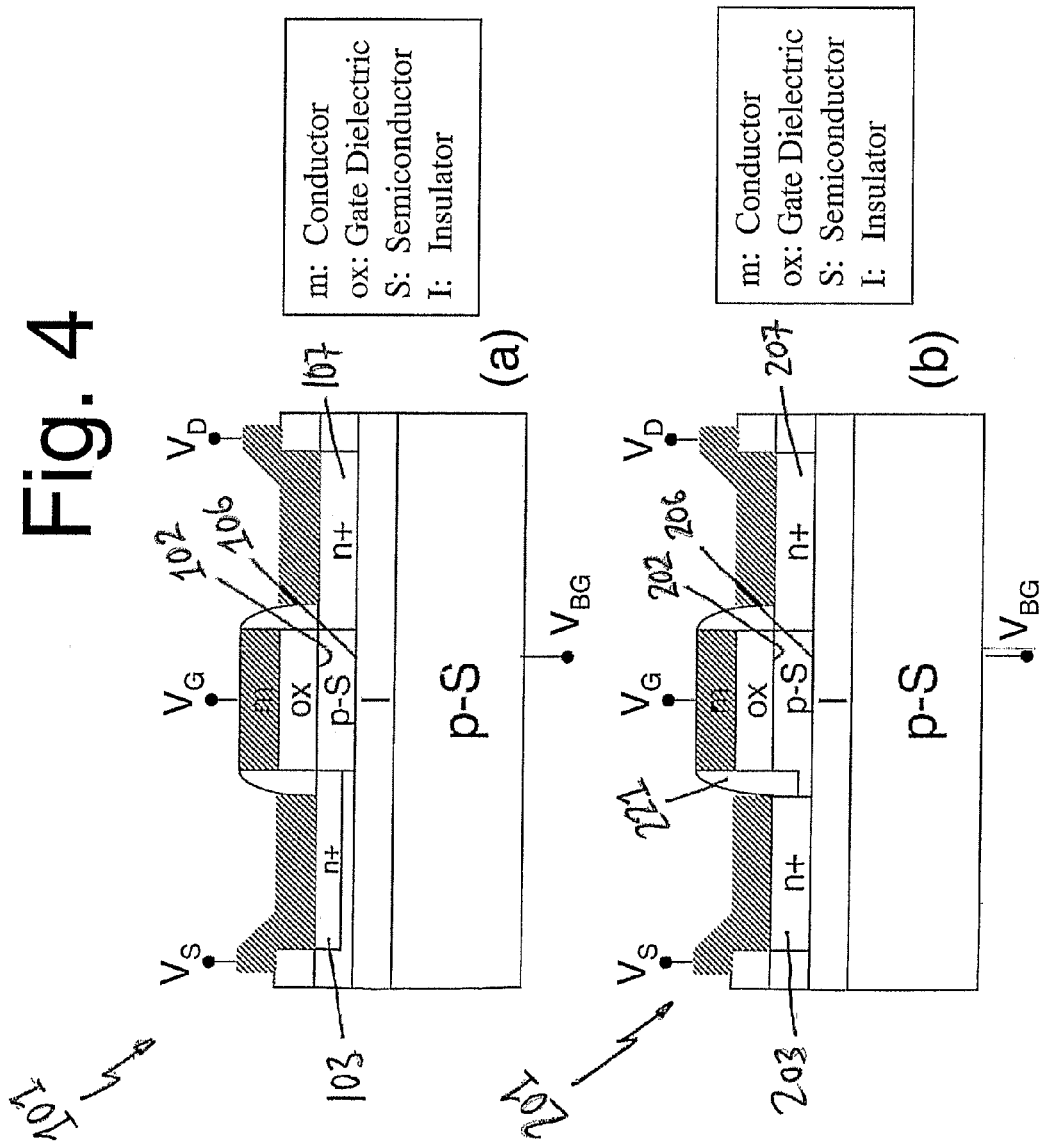
FIG. 4 illustrates in schematic form (a) an All-N-channel Complementary Field-Effect Transistor (ANCFET) or Unipolar CMOS (U-CMOS) device configured as a front-channel NMOSFET (F-NFET), and (b) an ANCFET/U-CMOS device configured as a back-channel NMOSFET (B-NFET), in accordance with an aspect of the present invention.

The Applicant terms the transistor (101) shown in FIG. 4(a) the front-channel NMOSFET (or F-NFET).

Conversely, the transistor (201) shown in FIG. 4(b) turns on when the back-channel (i.e. at the back semiconductor/insulator interface (206)) is inverted, as the channel current can flow readily from the drain (207) to the source (203) through the back channel, but not when the front-channel (i.e. at the front dielectric/semiconductor interface (202)) is inverted, as the current flow through the front channel is blocked by the insulating region (i.e. the extended spacer oxide (221)) separating the source (203) and the front channel region (202). Again, while the illustrated example shows a modified source (203) and an unmodified drain (207), in practice either or both may be modified.

Similarly to the shallower source (or drain) junction of the F-NFET (101) described above, a modified source (or drain) junction can be achieved in a number of ways; for example by use of one or more spacers which are of a sufficient size to separate the source (203) (or drain (207)) from the front channel.

The Applicant terms the transistor (201) shown in FIG. 4(b) the back-channel NMOSFET (or B-NFET).

Figure 5:
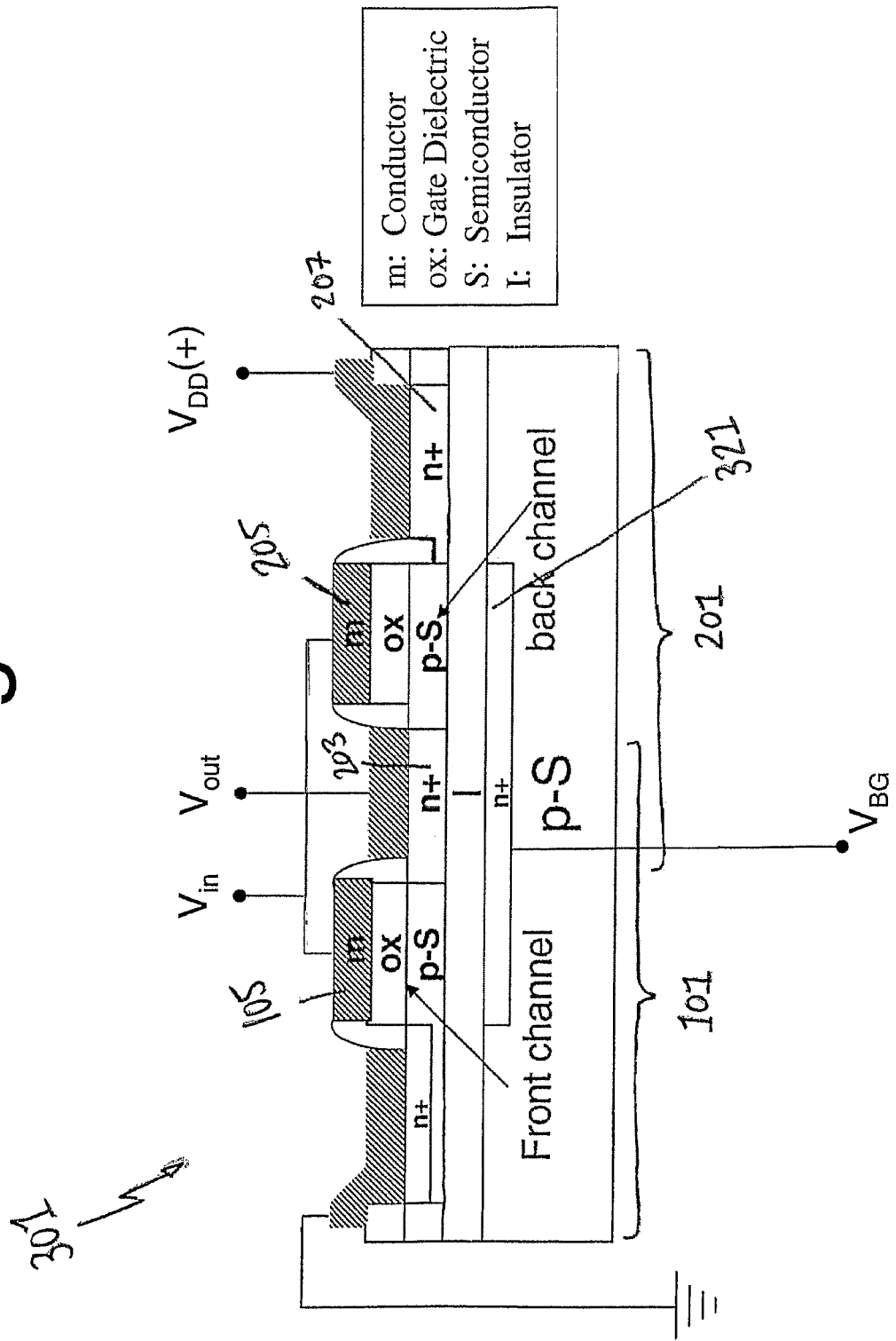
FIG. 5 illustrates in schematic form an all N-channel CMOS inverter, comprising a F-NFET device and a B-NFET device, in accordance with an aspect of the present invention.

Using the above described devices (101,201), one can realize a U-CMOS inverter (301) by connecting a F-NFET (101) in series with a B-NFET (201); very similar in structure to a conventional CMOS inverter (e.g. 21) but where the NMOSFET (1) is replaced by a F-NFET (101) and the PMOSFET (11) is replaced by a B-NFET (201). An example of such a device is illustrated in FIG. 5, which also shows the presence of an embedded back gate (321) comprising a heavily doped n+ region. Note that in this example, the B-NFET (201) has a modified drain (207) instead of a modified source (203) as illustrated in FIG. 4(b).

The U-CMOS inverter (301) works as follows. The input voltage ($V_{in}$) is applied to the front gates (105,205) of both the F-NFET (101) and B-NFET (201), and its complement is simultaneously applied to the back gate (321). When the input voltage is "high" (i.e. $V_{in}>V_{tf}$) the back gate is at "low" (i.e. $V_{bg}=0$ V), and the F-NFET (101) is turned on while the B-NFET (201) is turned off, which makes $V_{out}$ "low" (i.e., $V_{out}=0$ V). When the input voltage is "low" (i.e. $V_{in}=0$ V), the back gate is at "high" (i.e. $V_{bg}>V_{tb}$) and the B-NFET (201) is turned on while the N-NFET (101) is turned off, which makes $V_{out}$ "high" (i.e., $V_{out} \sim V_{dd}$). Thus the inverter (301) behaves as expected; a "high" input produces a "low" output, and a "low" input produces a "high" output.

It is also apparent from the illustration in FIG. 5 that the cell size of the U-CMOS inverter (301) is further reduced from that of conventional CMOS inverters due to the absence of the isolation between p and n channels, and the sharing of a common source/drain contact in the middle.

The U-CMOS transistors (101,201) described in the examples above may be modified such that either the front gate insulator (425,525) or the back gate insulator (427,527) (or both) is replaced by a semi-insulating semiconductor with a larger bandgap than the channel semiconductor. In the examples that follow, InGaAs is employed as the semiconductor channel material. However, it will be evident that other semiconductor materials may be used instead.

FIG. 6(a) illustrates an example of such a front-channel NFET (F-NFET) (401) while FIG. 6(b) illustrates an example of a back-channel NFET (B-NFET) (501) employing III-V semiconductors indium gallium arsenide (InGaAs) and a wide bandgap semiconductor (WBS); WBS having a much larger bandgap than that of InGaAs.

Figure 6:
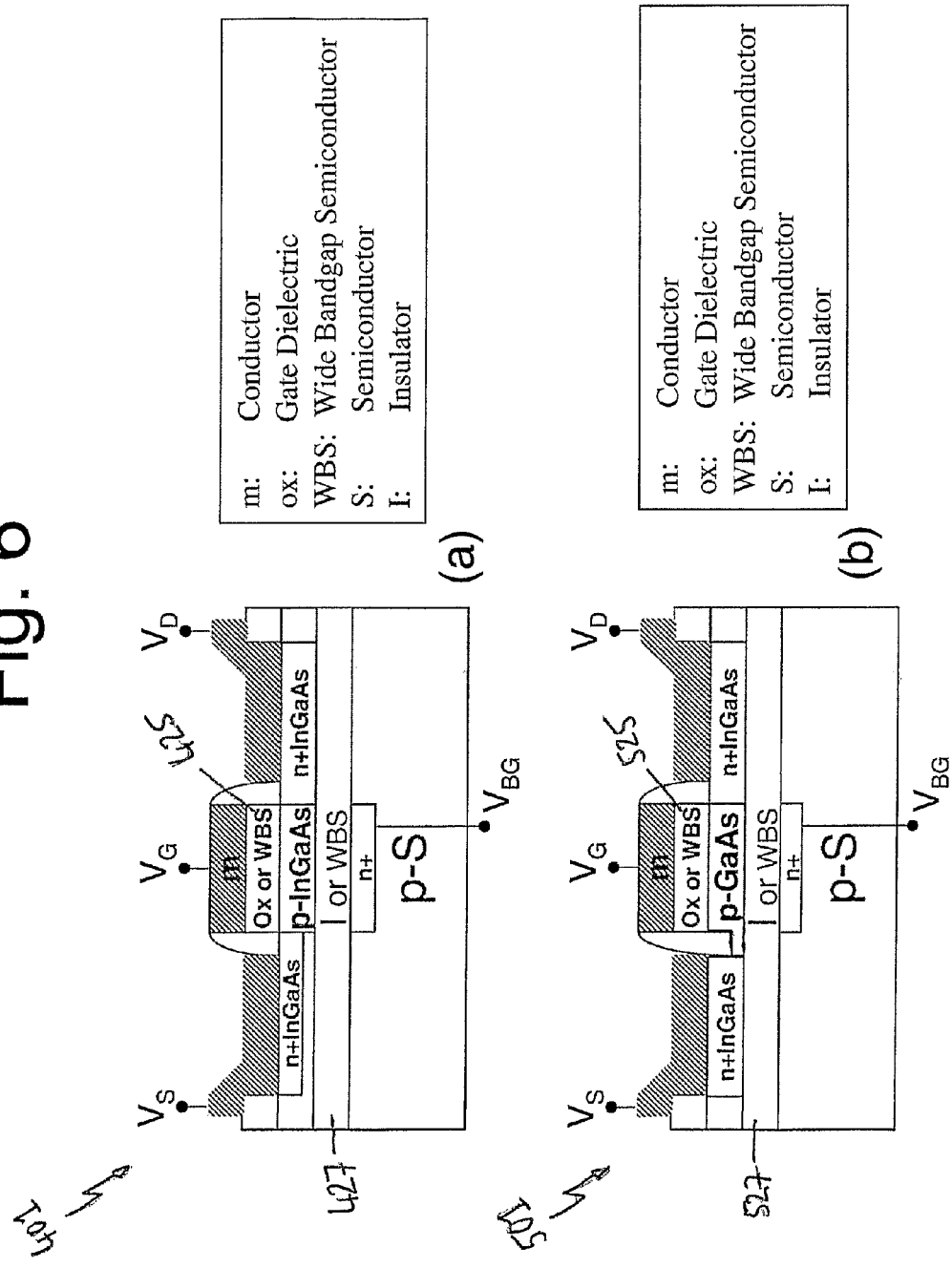
FIG. 6 illustrates in schematic form (a) an alternative F-NFET device, and (b) an alternative B-NFET device, illustrating that the front gate and back gate insulators may be replaced with semi-insulating wide bandgap semiconductors, in accordance with an aspect of the present invention.
Figure 7:
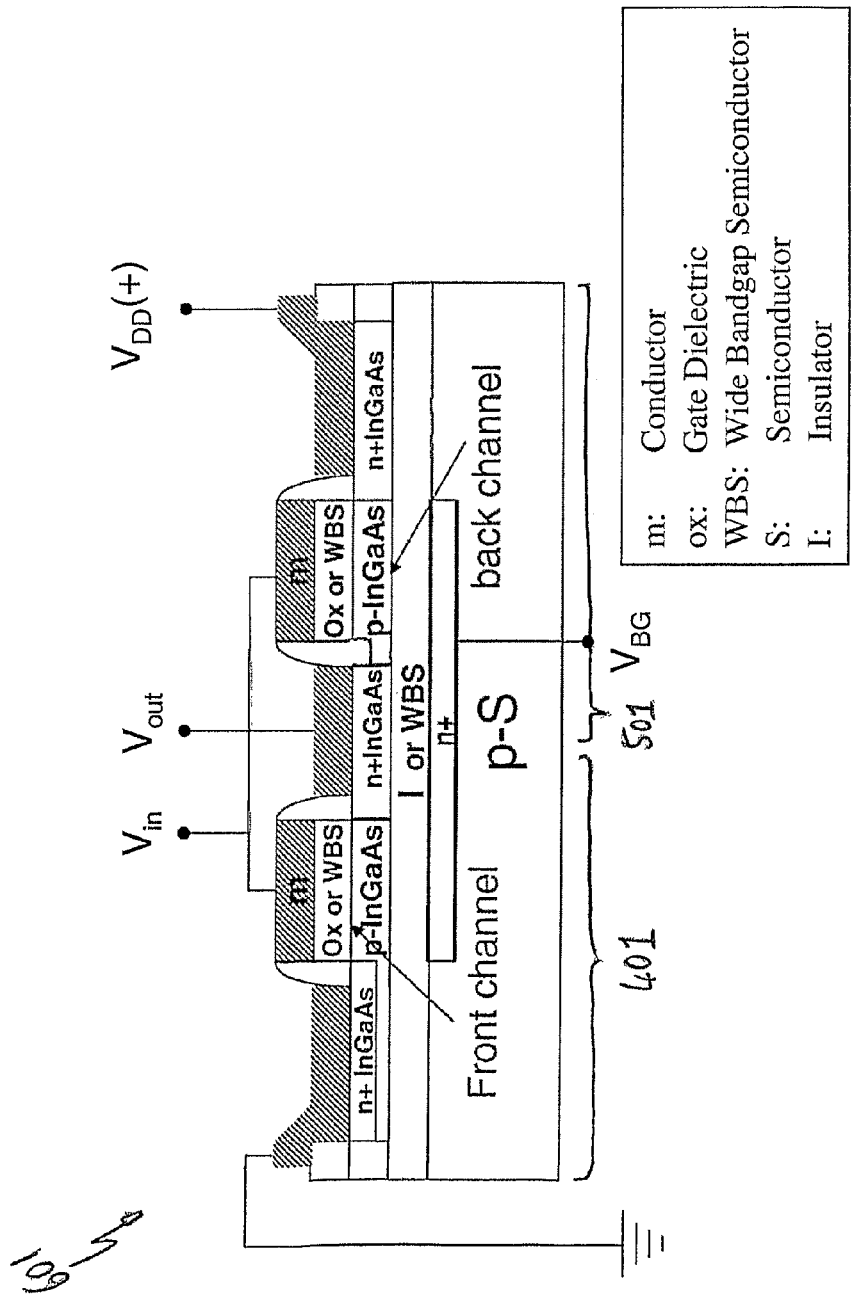
FIG. 7 illustrates in schematic form an all-N-channel CMOS inverter, comprising the alternative F-NFET and B-NFET devices, in accordance with an aspect of the present invention.

FIG. 7 shows the corresponding III-V material U-CMOS inverter (601) with only N-channel transistors (401,501), which are based on the F-NFET (401) and the B-NFET (501) devices shown in FIGS. 6(*a*) and 6(*b*) respectively.

The exemplary U-CMOS transistors (101,201,401,501) (and corresponding inverter circuits (301,601)) described above are based on "inversion-mode" transistors. The Applicant provides a further example based on "accumulation-mode" transistors (with slight modifications).

Figure 8:
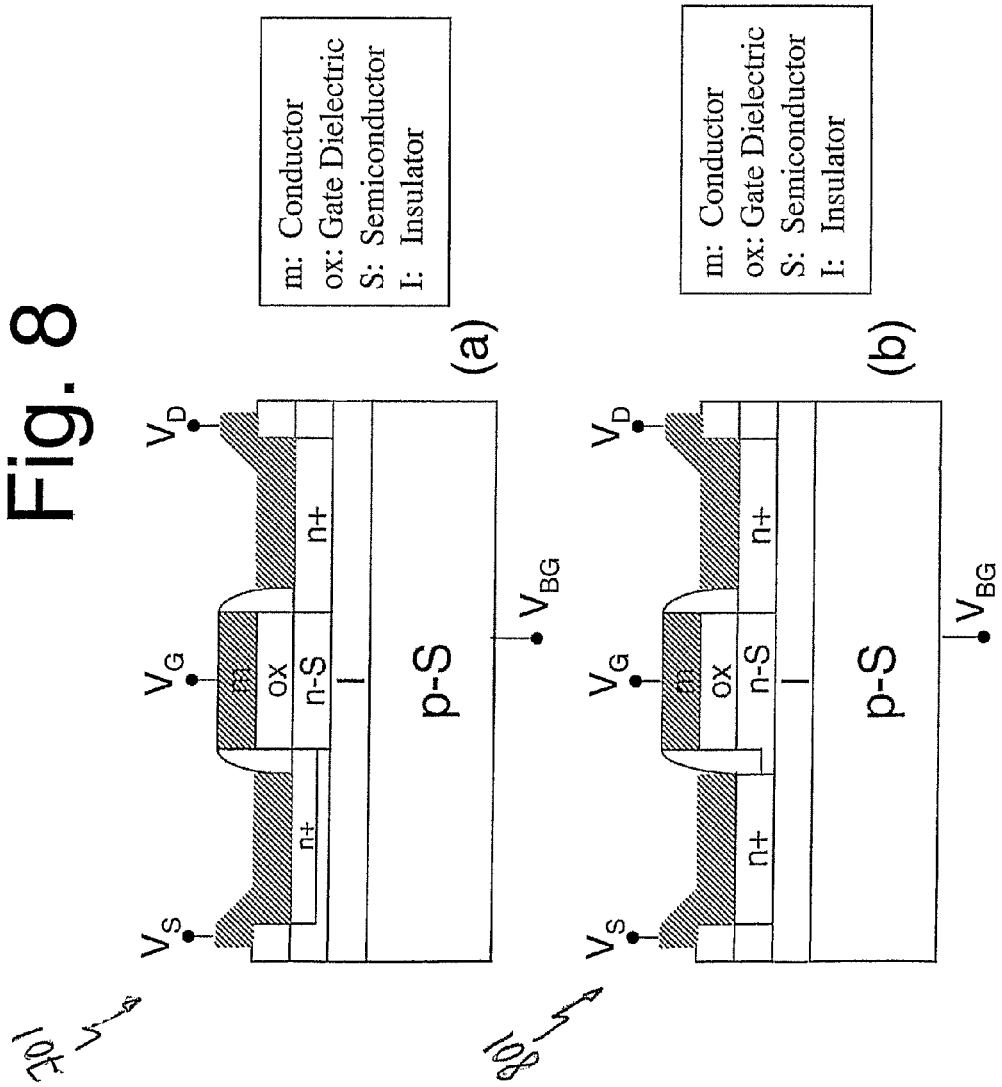
FIG. 8 illustrates in schematic form (a) an alternative ANCFET device, configured as a front-channel NMOSFET in accumulation mode and (b) an alternative ANCFET device, configured as a back-channel NMOSFET in accumulation mode, in accordance with an aspect of the present invention.
Figure 9:
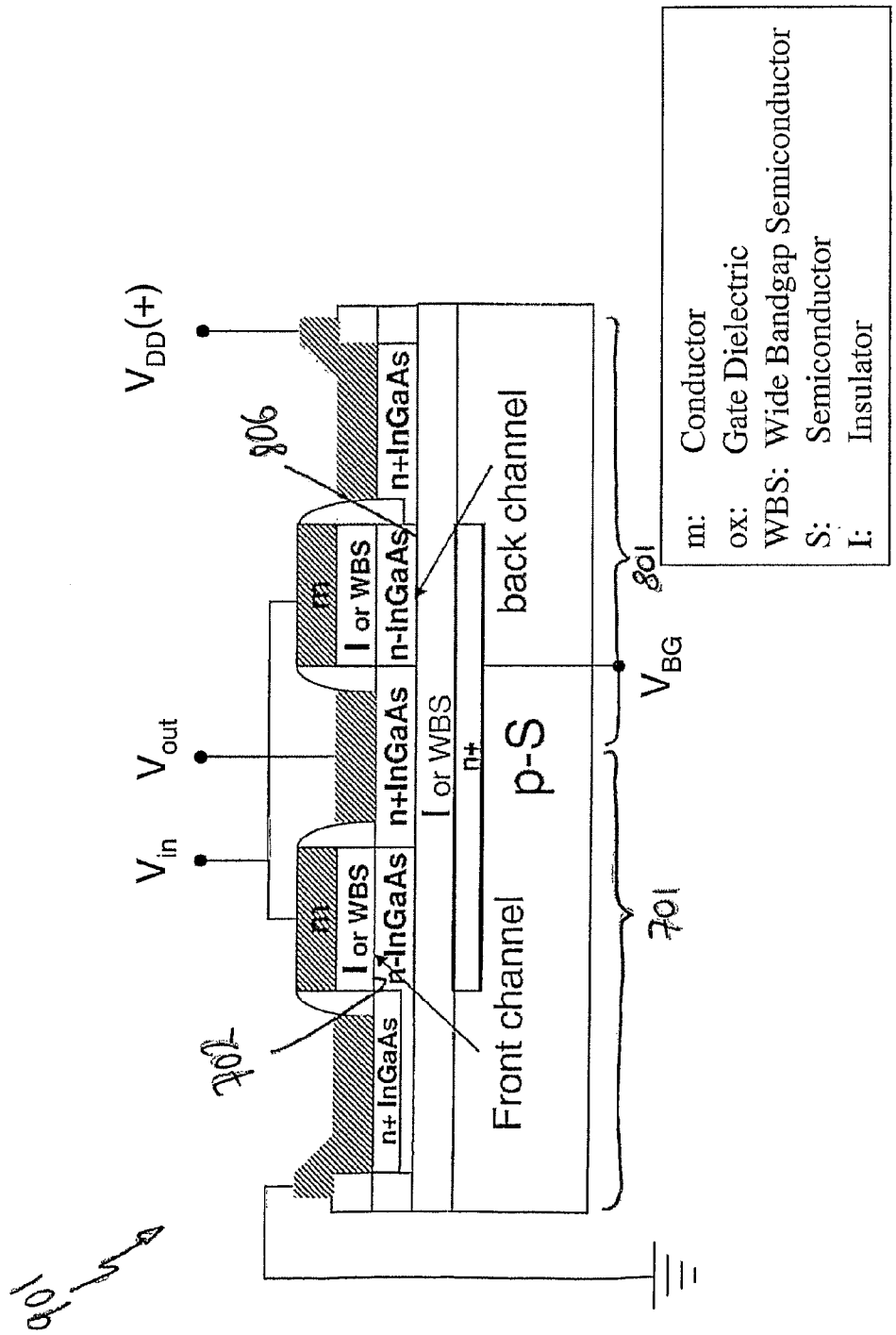
FIG. 9 illustrates in schematic form an alternative all-N-channel CMOS inverter consisting of an accumulation-mode F-NFET and an accumulation-mode B-NFET, in accordance with an aspect of the present invention.

FIGS. 8 (*a*) and 8 (*b*) illustrate "accumulation-mode" transistors (701,801) and FIG. 9 illustrates an example of an "accumulation-mode" inverter (901), where both the F-NFET (701) and B-BFET (801) devices are "accumulation-mode". By way of explanation, the n-InGaAs channels in both transistors (701,801) are fully depleted when no gate voltage is applied, and only the F-NFET (701) is turned on when the front channel (702) is driven to accumulation by a positive gate voltage (with respect to $V_{BG}$), while only the B-NFET (801) is turned on when the back channel (806) is driven to accumulation by a negative gate voltage (with respect to $V_{BG}$). The accumulation-mode version is advantageous for semiconductors where it is difficult to form inversion layers, or for semiconductors that are only suitable for n-type or p-type doping, but not both.

Note that while an inverter has been described in order to illustrate one example of an application of the U-CMOS concept, it will be readily appreciated that any logic gate that can be constructed using CMOS transistors can also be constructed using U-CMOS transistors. In this way not only can an inverter circuit (also termed a NOT gate) be realised, but any logic circuit (e.g. NAND, AND, NOR, OR, and XOR gates) or combination of logic circuits can be constructed using an arrangement of U-CMOS transistors.

Figure 10:
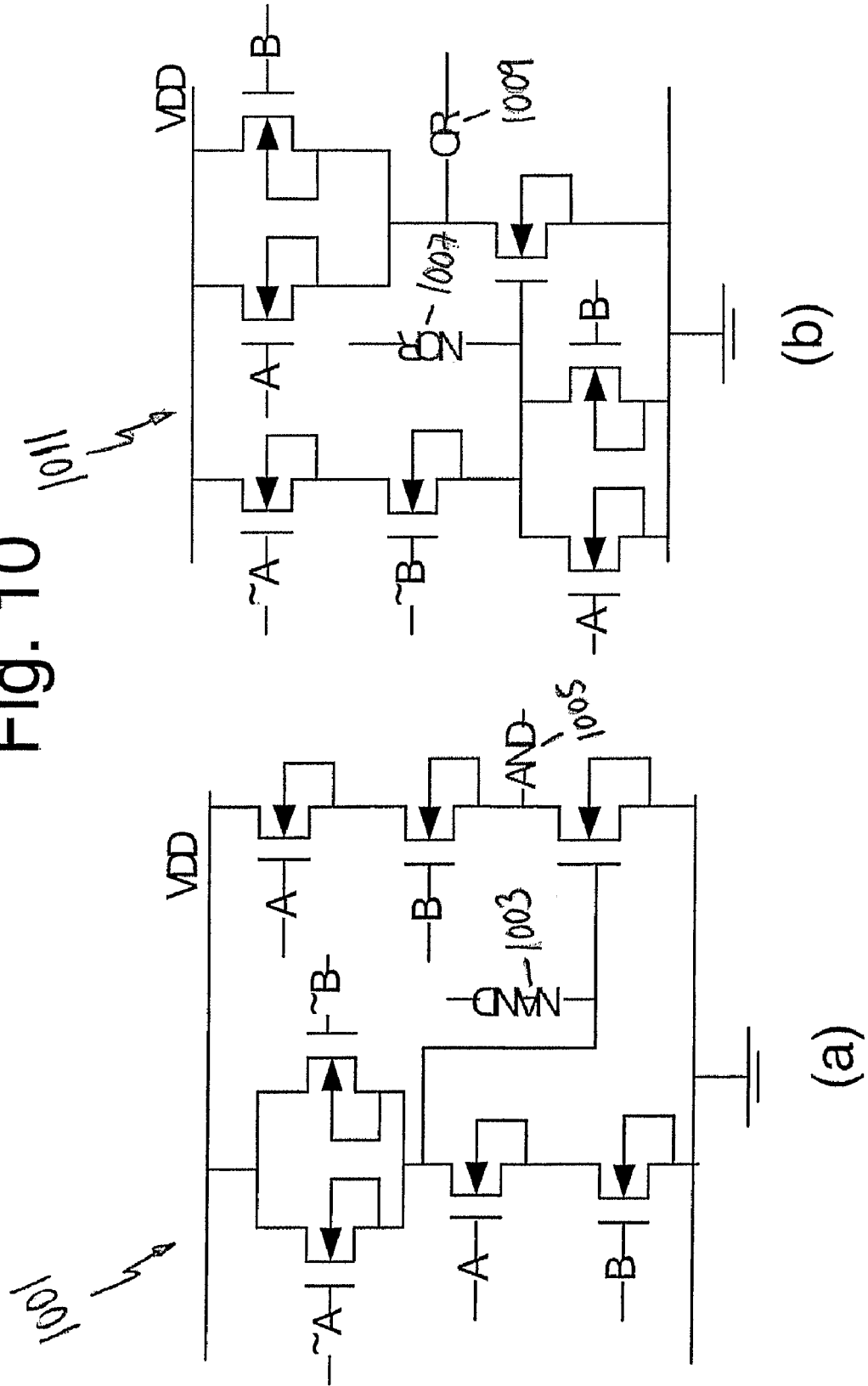
FIG. 10 illustrates examples of how logic circuits may be constructed using U-CMOS transistors in (a) a NOR/OR gate and (b) a NAND/AND gate; indicating the location of each of the "A NOR B", "A OR B", "A NAND B" and "A AND D" logic outputs.

FIG. 10 illustrates some examples of how logic circuits may be constructed using U-CMOS transistors in (a) a NAND/AND gate (1001) and (b) a NOR/OR gate (1011); indicating the location of each of the "A NAND B" (1003), "A AND B" (1005), "A NOR B" (1007) and "A OR B" (1009) logic outputs. The similarity to conventional CMOS transistor arrangements will be evident.

Figure 11:
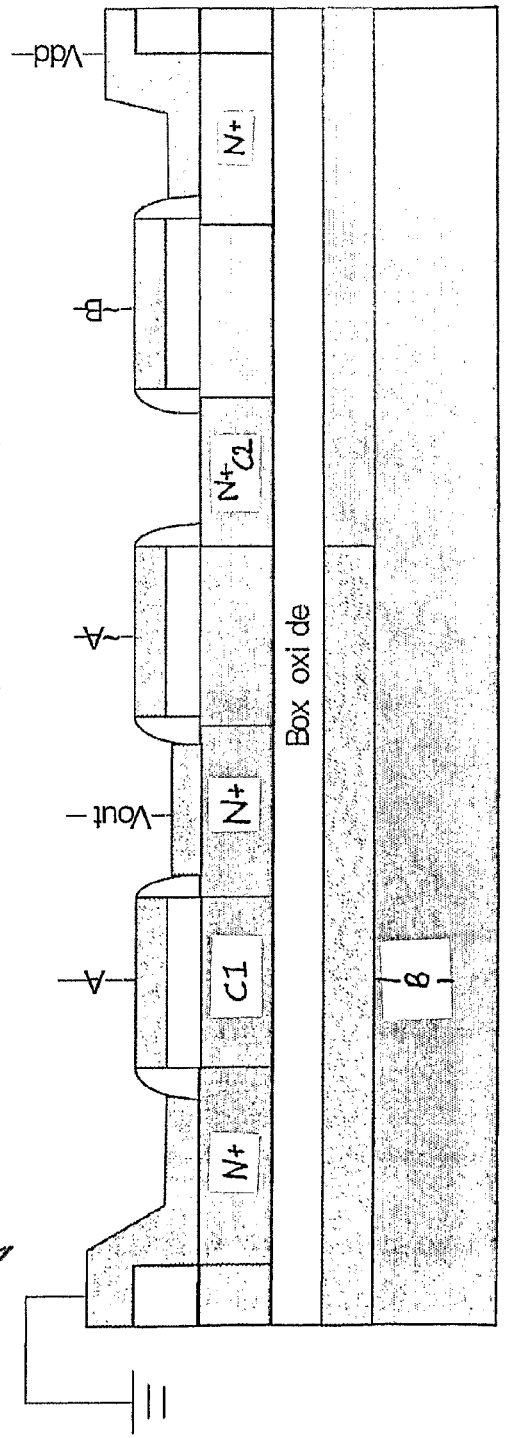
FIG. 11 illustrates an example of a U-CMOS NOR gate device, $V_{out}$ being "A NOR B"; the device also capable of operating as a NAND, OR or AND gate device by exchanging the inputs.

FIG. 11 illustrates an example of a U-CMOS NOR gate device (1101), $V_{out}$ being "A NOR B". This device is also capable of operating as a NAND, OR, or AND gate device by exchanging the inputs. For example, swapping A and ~A (complement of A) will change the output $V_{out}$ to "A NAND B"; swapping B and ~B (complement of B) will change $V_{out}$ to "A AND B"; and swapping ground with $V_{dd}$ will change $V_{out}$ to "A OR B".

Unipolar CMOS, as herein described, can essentially follow conventional CMOS architectures; with the result that developments in integrated circuits, system-on-a-chip devices etc. may all take advantage of the inherent benefits. In addition, U-CMOS devices are easier to realise in practice than corresponding leading-edge CMOS devices because there is no need to employ the complicated manufacturing methods (e.g. expensive strain techniques) and complex (and hence costly) materials that have been developed to speed up p-channel MOSFETS.

Figure 1:
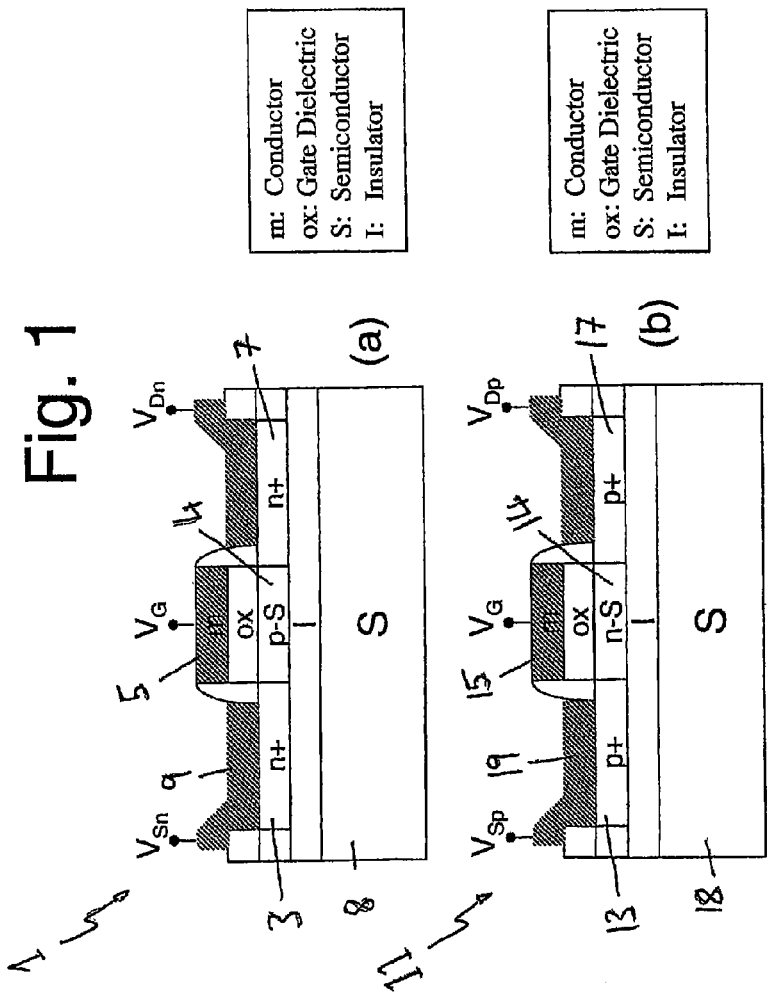
FIG. 1 illustrates in schematic form (a) a conventional N-channel Metal Oxide Semiconductor Field Effect Transistor (NMOSFET) built on a SOI (semiconductor-on-insulator) wafer and (b) a conventional P-channel MOSFET (PMOSFET) built on a SOI (semiconductor-on-insulator) wafer, both as comprised in the state of the art.
Figure 2:
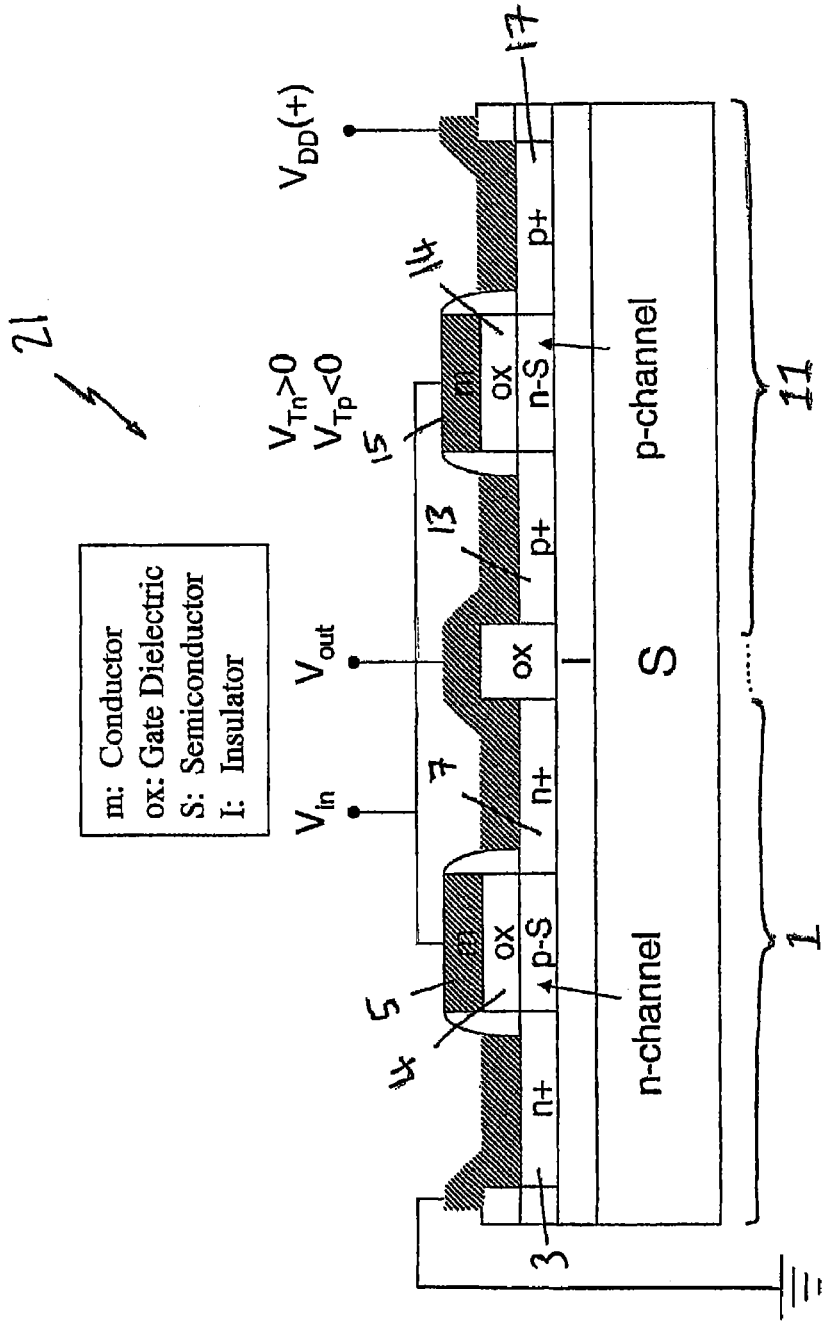
FIG. 2 illustrates in schematic form a conventional logic inverter comprising an NMOSFET and a PMOSFET built on a SOI (semiconductor-on-insulator) wafer, as comprised in the state of the art.

In addition, because the source and drain of U-CMOS devices will have the same dopant type, there is no need to provide isolation and in fact contacts can be shared (as illustrated, for example, in FIGS. 5, 7 and 9, c.f. FIG. 2). This has an obvious impact on scale and allows devices to be smaller still. It is anticipated that doing away with the need for isolation and allowing for contact sharing means that in addition to the carrier mobilities that can be achieved without having to have larger p-type channels (to compensate) could result in device density improvements of 2× or more. Smaller cell sizes also provide performance enhancements by virtue of scale alone.

It is the generally held view that CMOS is a superior technology to NMOS because it allows for much reduced power consumption, higher noise immunity and denser arrangements of logic devices on chip.

However the present invention allows us to revert to an all n-channel device configuration (or indeed all p-channel), rejecting the convention for devices requiring both n-channel and p-channel MOSFETs. This offers a multitude of advantages over conventional CMOS in addition to the anticipated performance and manufacturing benefits (as discussed above).

Investigations continue worldwide as to how to push the limits as to what can be achieved with CMOS. For example, one area of current research seeks to employ Germanium in SOI CMOS devices (see Table 1; Ge has significantly higher hole mobility than Silicon) by using SiGe in the p-channels. All such attempts at present are solely concerned with improving CMOS.

Another recent example illustrating the current focus on improving CMOS rather than developing an alternative, and also illustrating another instance where U-CMOS can solve a long-standing problem, is the recent development of so-called "flexible" CMOS using amorphous silicon and polymer semiconductor materials (see http://www.electronicsweekly.com/Articles/2009/06/11/46268/university-of-texas-makes-flexible-cmos.htm). This article clearly shows that people have had difficulty in making CMOS transistors with amorphous Si (because it is nearly impossible to make viable p-channel transistors) or polymer semiconductors (because it is too difficult to make n-channel transistors). Unipolar CMOS can provide a solution to these limitations without having to rely on hybridisation.

The present invention offers an alternative to CMOS with many benefits because many of the limitations of conventional CMOS do not apply. While the principles presented in the present Application represent a clear change in thinking, the Applicant submits that the present invention is a realistic alternative to CMOS and poses the answer to how technology can continue to develop in the post-CMOS era which may begin as soon as the end of this decade.

Further modifications and improvements may be added without departing from the scope of the invention as defined by the appended claims. For example, where the invention has been described with reference to inversion-mode transistors it will be evident that the same principles will apply, mutatis mutandis, to others such as accumulation-mode transistors (as briefly described). Furthermore, it is readily apparent that where all-n-channel devices are proposed, all-p-channel devices may equally be created. In addition, it will also be appreciated that the novel concepts disclosed herein apply equally to and may be readily implemented in multigate devices structures such as FinFET, double-gate, gate-all-round or Tri-gate/3-D structures and the like. The same concept can be applied to field-effect transistors made of such materials as graphene, carbon nanotubes, and organic molecules.

The invention claimed is:

1. An improved complementary metal oxide semiconductor (CMOS) field effect transistor (FET), the FET comprising:
    a drain;
    a source;
    a body region therebetween;

wherein at least one of the drain and the source is adapted such that when the body region undergoes inversion at a first surface current is able to flow between the drain and the source and when the body region undergoes inversion at a second surface current is not able to flow between the drain and the source; and wherein the FET is selected from the group consisting of:
an enhancement-mode FET with an inverted channel at one or both of the first and second surfaces; and
an enhancement mode FET with an accumulated channel at one or both of the first and second surfaces.

2. A FET as described in claim 1, wherein the FET comprises:
a front channel at the first surface associated with a front gate;
a back channel at the second surface associated with a back gate; and
wherein the front channel is capable of inversion when a positive voltage with respect to the back gate is applied to the front gate and the back channel is capable of inversion when a negative voltage with respect to the back gate is applied to the front gate.

3. A FET as described in claim 1, wherein the FET comprises:
a front channel at the first surface;
a back channel at the second surface; and
wherein the front channel is capable of inversion when a negative voltage with respect to the back gate is applied to the front gate and the back channel is capable of inversion when a positive voltage with respect to the back gate is applied to the front gate.

4. A FET as described in claim 2, wherein at least one of the source and the drain is separated from the back channel such that when the front channel is inverted current may flow between the source and the drain but when the back channel is inverted current may not flow between the source and the drain.

5. A FET as described in claim 2, wherein at least one of the source and the drain is separated from the front channel such that when the front channel is inverted current may not flow between the source and the drain and when the back channel is inverted current may flow between the source and the drain.

6. An improved complementary metal oxide semiconductor (CMOS) device comprising a plurality of FETs as described in claim 1, wherein the body region of each of the plurality of FETs comprises an n-type semiconductor material or the body region of each of the plurality of field effect transistors comprises a p-type semiconductor material.

7. A device as described in claim 6, comprising:
at least a first FET and a second FET;
wherein at least one of the drain and the source of the first FET is adapted such that the first FET has a positive threshold voltage; and
wherein at least one of the drain and the source of the second FET is adapted such that the second FET has a negative threshold voltage.

8. A device as described in claim 7, wherein the first FET is connected to the second FET.

9. A device as described in claim 6, wherein at least one of the FETs comprises an enhancement mode FET with an inverted channel.

10. A device as described in claim 6, wherein at least one of the FETs comprises an enhancement mode FET with an accumulated channel.

11. A device as described in claim 6, wherein the CMOS device is an inverter comprising a first FET and a second FET connected in series, the first field effect transistor having a positive threshold voltage and the second field effect transistor having a negative threshold voltage.

12. A device as described in claim 6, wherein at least one of the FETs comprise:
a front channel at the first surface associated with a front gate;
a back channel at the second surface associated with a back gate; and
wherein the front channel is capable of inversion when a positive voltage with respect to the back gate is applied to the front gate and the back channel is capable of inversion when a negative voltage with respect to the back gate is applied to the front gate.

13. A device as described in claim 6, wherein at least one of the FETs comprise:
a front channel at the first surface;
a back channel at the second surface; and
wherein the front channel is capable of inversion when a negative voltage with respect to the back gate is applied to the front gate and the back channel is capable of inversion when a positive voltage with respect to the back gate is applied to the front gate.

14. A device as described in claim 12, wherein at least one of the source and the drain of at least one of the FETs is separated from the back channel such that when the front channel is inverted current may flow between the source and the drain but when the back channel is inverted current may not flow between the source and the drain.

15. A device as described in claim 12, wherein at least one of the source and the drain of at least one of the FETs is separated from the front channel such that when the front channel is inverted current may not flow between the source and the drain and when the back channel is inverted current may flow between the source and the drain.

16. A device as described in claim 7, wherein the drain of the first FET comprises or is integrally formed with the source of the second FET.

17. A field effect transistor (FET) comprising:
a substrate and a back gate contact connected to the substrate;
a semiconductor layer comprising a doped source region and a doped drain region of a first type separated by a body region of a second type;
a first insulator layer separating the semiconductor layer from the substrate;
a conductor layer comprising a source contact connected to the doped source region, a drain contact connected to the doped drain region, and a front gate contact associated with the body region;
a second insulator layer separating the body region of the semiconductor layer and the gate contact, the conductor layer and second insulator layer on the opposite side of the semiconductor layer from the substrate;
wherein the body region undergoes inversion when a voltage exceeding a threshold voltage is applied to the back gate contact, forming a back channel of charge carriers within the body region proximal to the first insulator layer; and
wherein at least one of the doped source region and the doped drain region is partially separated from the body region proximal to the first insulator layer such that the doped source region or doped drain region is not in contact with the back channel when said voltage is applied.

18. A FET as described in claim 17, wherein at least one of the doped source region and the doped drain region is separated from the first insulator layer by a distance that corresponds to or is larger than the depth of the back channel formed when said voltage is applied.

19. A FET as described in claim 17, wherein the FET further comprises one or more spacers between the first insulator layer and at least one of the doped source region and the doped drain region, the depth of the spacers corresponding to or greater than the depth of the back channel.

20. A FET as described in claim 19, wherein, one or more of the spacers is integrally formed with the insulator layer.

21. A field effect transistor (FET) comprising:
a substrate and a back gate contact connected to the substrate;
a semiconductor layer comprising a doped source region and a doped drain region of a first type separated by a body region of a second type;
a first insulator layer separating the semiconductor layer from the substrate;
a conductor layer comprising a source contact connected to the doped source region, a drain contact connected to the doped drain region, and a front gate contact associated with the body region;
a second insulator layer separating the body region of the semiconductor layer and the front gate contact, the conductor layer and second insulator layer on the opposite side of the semiconductor layer from the substrate;
wherein the body region undergoes inversion when a voltage exceeding a threshold voltage is applied to the front gate contact, forming a front channel of charge carriers within the body region proximal to the second insulator layer; and
wherein at least one of the doped source region and the doped drain region is partially separated from the body region proximal to the second insulator layer such that the at least one of the doped source region and the doped drain region is not in contact with the front channel when said voltage is applied.

22. A FET as described in claim 21, wherein the transistor further comprises one or more spacers between the second insulator layer and at least one of the doped source region and the doped drain region, the depth of the spacers corresponding to or greater than the depth of the front channel.

23. A FET as described in claim 22, wherein one or more of the spacers is integrally formed with the second insulator layer.

24. A FET as described in claim 21, wherein the transistor further comprises one or more spacers between a portion of the body region and at least one of the doped source region and the doped drain region, the spacers extending to a depth therebetween that corresponds to or is greater than the depth of the front channel.

25. A logic inverter comprising:
a front channel transistor comprising a field effect transistor, the field effect transistor comprising:
a substrate and a back gate contact connected to the substrate;
a semiconductor layer comprising a doped source region and a doped drain region of a first type separated by a body region of a second type;
a first insulator layer separating the semiconductor layer from the substrate;
a conductor layer comprising a source contact connected to the doped source region, a drain contact connected to the doped drain region, and a front gate contact associated with the body region;
a second insulator layer separating the body region of the semiconductor layer and the gate contact, the conductor layer and second insulator layer on the opposite side of the semiconductor layer from the substrate;
wherein the body region undergoes inversion when a voltage exceeding a threshold voltage is applied to the back gate contact, forming a back channel of charge carriers within the body region proximal to the first insulator layer; and
wherein at least one of the doped source region and the doped drain region is partially separated from the body region proximal to the first insulator layer such that the doped source region or doped drain region is not in contact with the back channel when said voltage is applied;
a back channel transistor comprising a field effect transistor as described in claim 21; and
wherein the source of the back channel field effect transistor is operatively connected to the drain of the front channel field effect transistor.

26. A logic inverter as described in claim 25, further comprising a substrate which forms the substrate of both the front channel field effect transistor and the back channel field effect transistor.

27. A logic inverter as described in claim 25, wherein the drain of the front field effect transistor comprises or is integrally formed with the source of the back field effect transistor.

28. A logic inverter as described in claim 25, wherein the substrate comprises a buried back gate comprising a doped semiconductor material that forms a back gate of both the front field effect transistor and the back field effect transistor.

29. A logic inverter as described in claim 25, wherein the substrate comprises a buried back gate comprising a conducting material that forms a back gate of both the front field effect transistor and the back field effect transistor.

30. A logic circuit comprising one or more field effect transistors as described in claim 17.

31. A logic circuit as described in claim 30, comprising a plurality of field effect transistors arranged so as to form one or more logic gates selected from the group comprising AND, OR, NAND, NOR, XOR and NOT gates.

32. A logic circuit comprising:
one or more field effect transistors, the one or more field effect transistors comprising:
a substrate and a back gate contact connected to the substrate;
a semiconductor layer comprising a doped source region and a doped drain region of a first type separated by a body region of a second type;
a first insulator layer separating the semiconductor layer from the substrate;
a conductor layer comprising a source contact connected to the doped source region, a drain contact connected to the doped drain region, and a front gate contact associated with the body region;
a second insulator layer separating the body region of the semiconductor layer and the gate contact, the conductor layer and second insulator layer on the opposite side of the semiconductor layer from the substrate;
wherein the body region undergoes inversion when a voltage exceeding a threshold voltage is applied to the back gate contact, forming a back channel of charge carriers within the body region proximal to the first insulator layer; and wherein at least one of the doped source region and the doped drain region is partially separated from the body region proximal to the first insulator layer such that the doped source region or doped drain region is not in contact with the back channel when said voltage is applied; and the logic circuit further comprising one or more logic inverters as described in claim 25.

* * * * *

UNITED STATES PATENT AND TRADEMARK OFFICE
CERTIFICATE OF CORRECTION

PATENT NO. : 8,384,156 B2  
APPLICATION NO. : 12/996067  
DATED : February 26, 2013  
INVENTOR(S) : Ma et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 119 days.

Signed and Sealed this  
First Day of September, 2015

Michelle K. Lee  
*Director of the United States Patent and Trademark Office*